United States Patent [19]

Kumagai

[11] Patent Number: 5,248,852
[45] Date of Patent: Sep. 28, 1993

[54] RESIN CIRCUIT SUBSTRATE AND MANUFACTURING METHOD THEREFOR

[75] Inventor: Koichi Kumagai, Ikoma, Japan

[73] Assignee: Matsushita Electric Industrial Co., Ltd., Osaka, Japan

[21] Appl. No.: 600,803

[22] Filed: Oct. 22, 1990

[30] Foreign Application Priority Data

Oct. 20, 1989 [JP] Japan ................................. 1-274106

[51] Int. Cl.⁵ .............................................. H05K 1/00
[52] U.S. Cl. ...................................... 174/250; 174/260
[58] Field of Search ............... 174/250, 251, 255, 260, 174/52.2; 361/401; 357/58, 59; 156/307.3; 252/512; 29/856

[56] References Cited

U.S. PATENT DOCUMENTS

| | | | |
|---|---|---|---|
| 3,206,647 | 9/1965 | Kahn | 174/52.2 X |
| 3,679,941 | 7/1972 | LaCombe et al. | 174/250 X |
| 3,885,304 | 5/1975 | Kaiser et al. | 174/52.2 X |
| 4,143,456 | 5/1979 | Inoue | 174/52.2 X |
| 4,639,830 | 1/1987 | Fukuoka | 174/250 X |
| 4,751,126 | 6/1988 | Oodaira et al. | 156/307.3 X |
| 4,788,104 | 11/1988 | Adriaensen | 252/512 X |
| 4,984,034 | 1/1991 | Yamazaki | 357/58 X |

*Primary Examiner*—Leo P. Picard
*Assistant Examiner*—Trinidad Korka
*Attorney, Agent, or Firm*—Wenderoth, Lind & Ponack

[57] ABSTRACT

A resin circuit substrate includes: a plurality of electronic parts having electrodes to be electrically connected to each other, with surfaces of the electrodes being disposed flush with each other; a resin for integrally molding surfaces of the electronic parts other than the surfaces of the electrodes so that the electronic parts are retained with the resin; and a circuit pattern for electrically connecting the electrodes to each other, the circuit pattern being laminated on exposed surfaces of the electrodes. A method for manufacturing the resin circuit substrate includes the steps of: positioning the electronic parts on a base having a flat surface so that surfaces of the electrodes contact the flat surface of the base; molding the electronic parts so as to be integrated with the resin on the flat surface thereof to form a molded part; hardening, drying or aging the molded part integrated with the electronic parts; removing the base from the molded part; printing a conductive resin onto the molded part to form a circuit pattern in such a manner that the conductive resin is laminated on a surface, of the molded part, including the surfaces of the electrodes; and hardening or drying the conductive resin.

10 Claims, 2 Drawing Sheets

RESIN CIRCUIT SUBSTRATE AND MANUFACTURING METHOD THEREFOR

BACKGROUND OF THE INVENTION

The present invention relates to a substrate of an electronic circuit and more particularly to a circuit substrate composed of a resin and to a method therefor.

A conventional substrate of an electronic circuit comprises a wiring substrate and electronic parts. The wiring substrate includes a base substrate and a metal foil such as copper foil laminated on the base substrate. The electronic parts are mounted on the base substrate. The base substrate is made of a compound resin consisting of a mixture of glass and epoxy resin or, a mixture of paper and epoxy resin, or a mixture of paper and phenolic resin, a mixture of glass and polyimide resin. The copper foil is etched to form a pattern thereon to manufacture the wiring substrate. Electronic parts are arranged on the wiring substrate to solder the electrodes thereof into those of the wiring substrate so that the electronic parts are fixed to the wiring substrate and electrically connected thereto. Thus, an electronic circuit substrate is constructed.

However, the above-described prior art has the following problems:

First, the material for connecting the electrodes of the electronic parts to those of the wiring substrate is required to perform the function of retaining the electronic parts therein and accomplishing an electrical connection. That is, the material is required to have both the characteristics of a preferable adhesive strength and a connection resistance value. It is known that Sn/Pb alloy is the most reliable material for bearing the above two characteristics. As such, in the manufacture of an electronic circuit substrate, conventionally, soldering is necessarily employed to connect the electronic parts to the wiring substrate. It is expensive to provide a factory with equipment for performing a soldering operation, disposing a washing solution and a discharged gas, and preventing environmental pollution. Therefore, there are growing demands not only for the development of a technique, which replaces soldering, for connecting the electrodes of the electronic parts to those of the wiring substrate, but also for the development of a technique for manufacturing a circuit substrate.

Secondarily many steps are required to manufacture the conventional resin wiring substrate, including: adhesion of the base substrate to a prepreg plate; lamination of a copper foil on the base substrate; hardening of a resin; resist application to the wiring portion; photo-etching; wet copper foil etching; cleaning of the portion to be soldered; soldering operation; and application of resist and hardening thereof. In order to perform these operation steps, expensive equipment must be provided and delicate workmanship is required to manufacture a precise circuit substrate.

Thirdly, compared with a purchase price of a resin wiring substrate, a user is required to pay more to manufacture the resin wiring substrate by himself in order to shorten the lead time and manufacture it with desired electron parts depending on the production conditions.

Fourthly, in the conventional resin circuit substrate, fine electronic parts which have come into increasingly frequent use in recent years are not mounted on the wiring substrate with high accuracy. That is, in order to mount fine electronic parts on the wiring substrate with high accuracy of within 0.05 to 0.1, it is necessary to take the following measures: The utilization of the adhesiveness of a creamed material for use in a soldering or an adhesive agent exclusively used for electronic parts; the use of a device for reducing the vibration of an electronic parts mounting equipment; and the improvement of a nozzle structure used to mount electronic parts on the wiring substrate. However, accurate electronic circuit substrates are manufactured at a low percentage because electronic parts are not mounted on the wiring substrate at high accuracy.

SUMMARY OF THE INVENTION

It is therefore an object of the present invention to provide a resin circuit substrate and a method for manufacturing the same which can overcome the above-described disadvantages of using an expensive apparatus for manufacturing a resin circuit substrate, a soldering apparatus, equipment for disposing a washing solution and a discharged gas resulting from a soldering operation and preventing the environment from being polluted, and which saves time and labor and reliably facilitates the connection of electronic parts to a resin base.

In accomplishing these and other objects, according to a first aspect of the present invention, there is provided a resin circuit substrate comprising: a plurality of electronic parts having electrodes to be electrically connected to each other, with surfaces of the electrodes disposed flush with each other; a resin for integrally molding surfaces of the electronic parts other than the surfaces of the electrodes so that the electronic parts are retained with the resin; and a circuit pattern for electrically connecting the electrodes to each other, the circuit pattern being laminated on exposed surfaces of the electrodes.

According to a second aspect of the present invention, there is provided the resin circuit substrate wherein the resin is made of a compound selected from the group consisting of epoxy resin, phenolic resin, polyimide resin, and acrylate resin.

According to a third aspect of the present invention, there is provided the resin circuit substrate wherein the resin contains one of the fillers selected from the group consisting of glass, carbon, ceramic, cloth, and paper.

According to a fourth aspect of the present invention, there is provided the resin circuit substrate wherein the circuit pattern is made of a conductive material of a mixture of a resin and a compound selected from the group consisting of Ag, Cu, C, and alloy.

According to a fifth aspect of the present invention, there is provided the resin circuit substrate wherein the circuit pattern to connect the electrodes of the electronic parts to each other is protected with a resin film.

According to a sixth aspect of the present invention, there is provided a method for manufacturing a resin circuit substrate, comprising the steps of: positioning electronic parts on a base having a flat surface so that surfaces of electrodes of the electronic parts contact the flat surface of the base; molding the electronic parts so as to be integrated with a resin on the flat surface of the base to form a molded part; hardening, drying or aging the molded part integrated with the electronic parts; removing the base from the molded part integrated with the electronic parts; printing a conductive resin onto the molded part to form a circuit pattern in such a manner that the conductive resin is laminated on a surface, of the molded part, including the surfaces of the electrodes of the electronic parts; and hardening or drying the conductive resin.

According to a seventh aspect of the present invention, there is provided the method wherein an adhesive agent is applied to the surface of the base on which the electronic parts are positioned.

According to an eighth aspect of the present invention, there is provided the method wherein a liquid resin is poured onto the base in the process for integrating the electronic parts with the resin.

According to a ninth aspect of the present invention, there is provided the method wherein a powdered resin is applied to the base and the electronic parts so as to compressibly integrate the electronic parts with the resin in the process for integrating the electronic parts with the resin.

According to a tenth aspect of the present invention, there is provided the method wherein in the process for printing the conductive resin onto the molded part to form the circuit pattern, an acceptable molded part integrated with the electronic parts is distinguished from a defective one and an error amount of a printing position of each electrode of the electronic parts with respect to a predetermined position is compensated, by visually inspecting the position and configuration of the surface of each electrode of the electronic parts positioned on a printing surface of the molded part integrated with the electronic parts.

According to the conventional method, electronic parts are mounted on a wiring substrate at a predetermined position thereof, and then the electrodes of the electronic parts are soldered to those of the wiring substrate so that the electronic parts are retained by the wiring substrate and electrically connected thereto, whereas according to the aspect of the present invention, electronic parts are mounted on the resin circuit substrate by the novel method.

As the fundamental principle of the aspect of the present invention, electronic parts are integrated with a resin so that the electronic parts are retained with the resin. It is not until a circuit pattern is laminated on the resin integrated with the electronic parts that the electrodes of the electronic parts are electrically connected to each other. The electrical connections of the electrodes of the electronic parts and the formation of the circuit pattern are simultaneously accomplished. To this end, the surfaces of the electrodes are flush with each other.

Preferably, the resin to be integrated with the electronic parts is made of at least one of epoxy resin, phenolic resin, polyimide resin, and acrylate resin in view of moldability, availability, cost, heat expansion performance, heat resistant performance, and strength properties. In order to further improve its heat release performance and its strength properties, one of the fillers selected from the group consisting of glass, carbon, ceramic, cloth, and paper is preferably contained in the resin to be integrated with the electronic parts. It is preferable that substances composing the filler are fibrous-structured or network-structured to strengthen the resin to a greater extent.

The circuit pattern formed to electrically connect the electrodes of the electronic parts integrated with the resin to each other is made of a conductive substance. Preferably, the network former of the conductive substance composing the circuit pattern is made of a resin in view of its adhesive strength to the resin and its thermal expansion coefficient. It is preferable that the conductive substance contained in the network former is made of at least one of Ag, Cu, C, Ni, and Pb/Sn alloy because these metals are inexpensive and low in resistance value.

It is important that the circuit pattern composed of the conductive resin which is a mixture of at least one of the above metals and the conductive resin composing the network former is protected with a film so as to prevent the circuit pattern from being damaged by an external mechanical shock, an expansion due to humidity absorption, and expansion-caused increase in resistance value. It is also important to prevent deterioration of the adhering strength of the conductive resin to the resin as well as the electrodes of the electronic parts. Preferably, the circuit pattern can be most favorably sealed with a film made of the same resin as that to be integrated with the electronic parts in view of its sealing performance. But it is possible to compose the protective film of a resin other than the resin integrated with the electronic parts. Preferable resins serving as the material of the film include epoxy resin, phenolic resin, polyimide resin, acrylate resin, and silicon resin. The strength properties of the protective film and the adhesive strength thereof can be improved to a great extent by containing a filler such as glass, carbon, or ceramic in a resin used.

According to the method for manufacturing a resin circuit substrate of the aspect of the present invention, the electronic parts are mounted on the base having the flat surface so that the electrodes are each mounted at a predetermined position and the upper surfaces thereof are flush with each other. Then, the resin is poured onto the base surrounded with a frame to mold the resin into a predetermined configuration and integrate it with the electronic parts and the base so that the electronic parts are retained with the resin. Thereafter, the molded part is hardened, dried or aged to display the characteristic thereof to the maximum and increase its heat resistant performance and its strength properties. Then, the base used for accurately positioning the electronic parts is removed from the molded part to expose the surfaces of the electrodes of the electronic parts to the outside. Then, a conductive resin is printed in a circuit pattern in such a manner that the conductive resin is laminated on the surface, of the molded part, including the surfaces of the electrodes of the electronic parts. The circuit pattern consisting of the conductive resin is hardened or dried to increase the strength of the film and stabilize its resistance value.

Preferably, in positioning the electronic parts on the flat surface of the base, the base is coated with an adhesive agent to prevent the electronic parts from being displaced.

In the process for integrating the electronic parts with the resin, preferably, a liquid resin is slowly poured onto the base, and the resin is then heated at an appropriate temperature. Otherwise, a powdered resin is preferably introduced onto the base and the electronic parts so that it covers the base and the electronic parts. Then, the resin is compressed onto the electronic parts with heat. Thus, the electronic parts can be prevented from being displaced.

According to the other aspect of the present invention, in the process for printing the circuit pattern onto the conductive resin, it is necessary to register the electrodes of the electronic parts and the circuit pattern with each other to electrically connect the electrodes to each other. To this end, the positions of the electrodes and the configurations thereof are visually checked and the displacement amount of each electrode with respect to a predetermined printing position is measured to make a correction for an error amount. Thus, acceptable products can be distinguished from defective ones.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Figure 1:
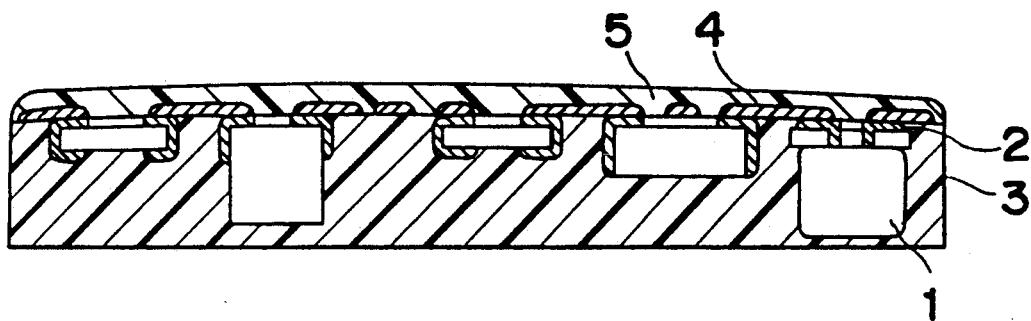
FIG. 1 is a sectional view showing a resin circuit substrate according to one embodiment of the present invention.

Before the description of the present invention proceeds, it is to be noted that like parts are designated by like reference numerals throughout the accompanying drawings.

Figure 3:
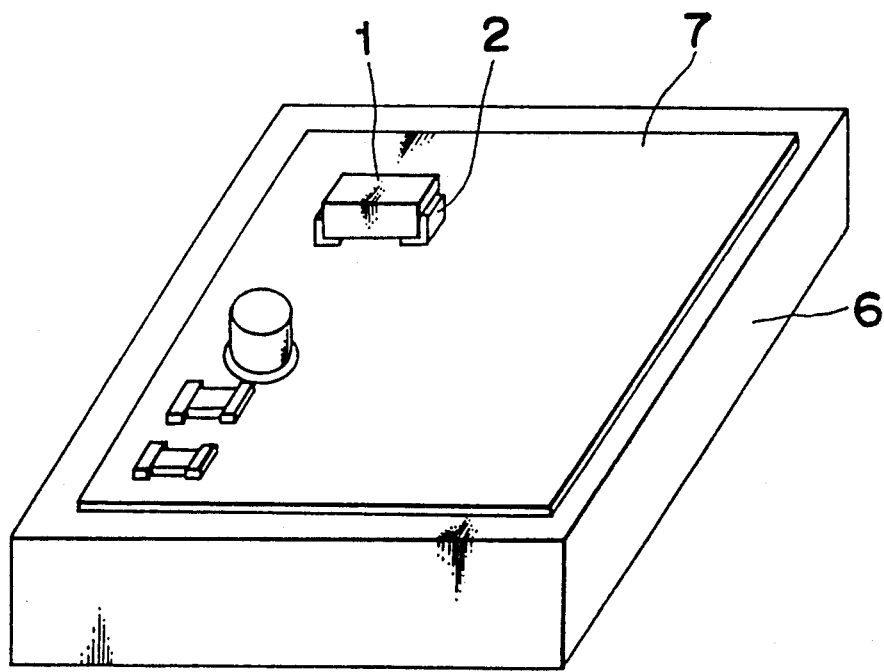
FIG. 3 is a perspective view showing electronic parts positioned on a base having a plane according to the embodiment.
Figure 2:
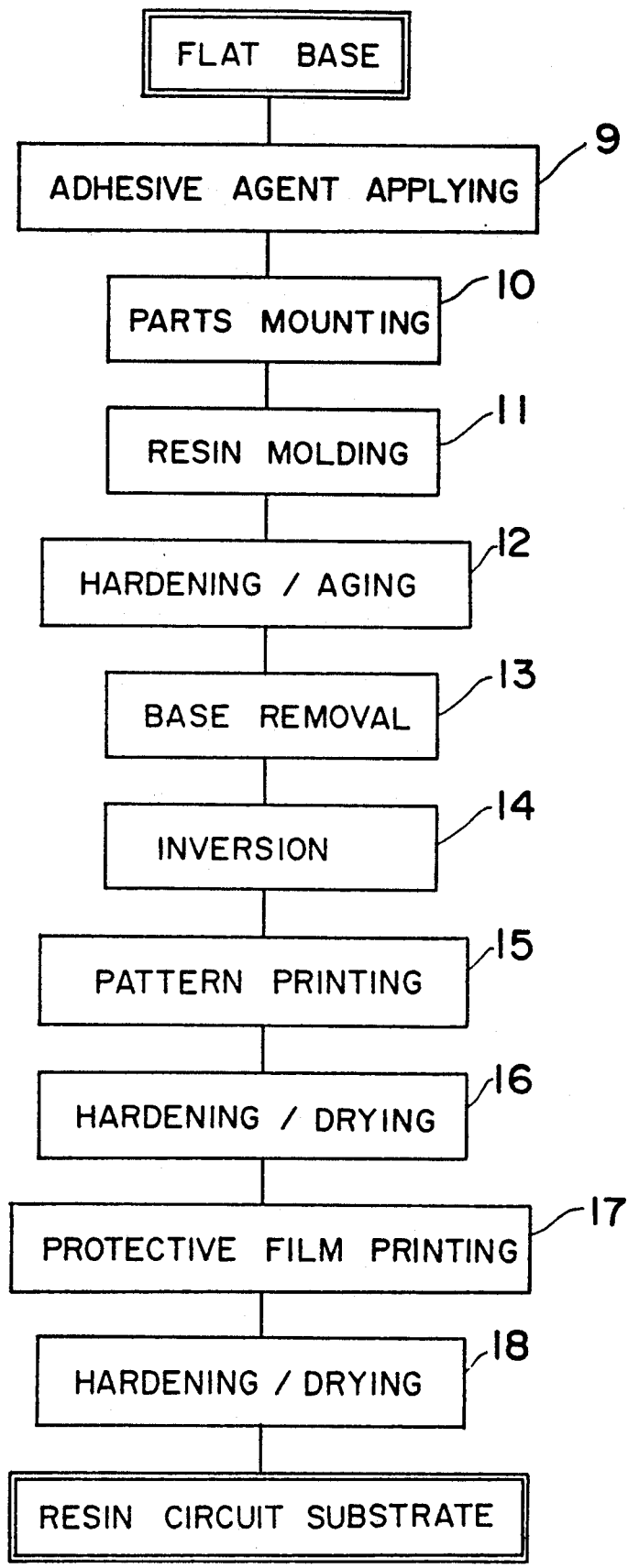
FIG. 2 is a flowchart showing a process for manufacturing the resin circuit substrate of FIG. 1.

There is shown in FIG. 1 a sectional view showing a resin circuit substrate according to an embodiment of the present invention. The circuit substrate comprises electronic parts 1, electrodes 2 of the electronic parts 1, a molded part integrated with the electronic parts, a circuit pattern 4, a protecting film 5, and an adhesive agent 7. FIG. 2 is a flowchart showing the process for manufacturing a resin circuit substrate according to the embodiment. FIG. 3 is a perspective view showing the electronic parts 1 positioned on a base 6 having a flat surface according to the embodiment.

First, an adhesive agent 7 is applied to the base 6 having the flat surface. In the adhesive agent applying process 9 shown in the flowchart of FIG. 2, the base 6 is made of SUS 301. The base is 15 mm thick and the outer dimension thereof is 120 mm×120 mm. The material of the base is machined so that the surface roughness Ra thereof is approximately 3-10 μm and the surface waviness thereof is 0.1 mm at the maximum. A 100 μm-thick urethane sheet having a self-adhesive strength is used as the adhesive agent 7 which is compressively adhered to the surface of the base 6.

Then, in the parts mounting process 10, the electronic parts 1 are each adhered to the adhesive agent 7 at a predetermined position thereof so that the electrodes 2 of the electronic parts 1 contact the surface of the adhesive agent 7. Chips (C) and (R) and an aluminum electrolytic capacitor of 1.6 mm×0.8 mm and 2.0 mm×1.0 mm and a tantalum electrolytic capacitor of 4.5 mm×3.2 mm are used as the electronic parts 1. Thereafter, in the resin molding process 11, a resin is poured onto the base 6 to integrate the electronic parts 1. The resin is then hardened in the hardening/aging process 12 to form the molded part 3. The resin poured onto the base 6 is a liquid resin of epoxy acrylate resin containing glass fiber which is 50-80 mm long and 1,000 cps in viscosity at 25° C. In pouring the resin onto the base 6, the base 6 is preferably surrounded with a frame to prevent the resin from flowing out of the base 6. The resin is hardened at 150° C. for 240 minutes in the hardening/aging process 12. Before hardening the resin, the resin is preferably left in a pressure-reduced atmosphere or in the atmospheric air to remove foams therefrom. In the resin molding process 11, when epoxy resin powders are used instead of epoxy acrylate resin, epoxy resin powders can be applied to the base 6 and the electronic parts 1, and then, the epoxy resin powders can be compressively heated to form the molded part 3.

Thereafter, in the base removing process 13, the base 6 is removed from the molded part 3. When the base 6 has been coated with the adhesive agent 7, it is necessary to remove the adhesive agent 7 from the molded part 3.

The molded part 3 is inverted to fix it to a table in the inverting process 14.

In the pattern printing process 15, a conductive resin composing the circuit pattern 4 is screen-printed onto the molded part 3. Before the circuit pattern 4 is printed, it is necessary to visually inspect whether there is a gap between the electrodes 2 and the molded part 3 and whether foams are left in the molded part 3 to distinguish perfect molded parts 3 from defective ones. The position of each electrode 2 of a perfect molded part 3 in relation to each predetermined printing position is calculated so that a screen-printing mask and each electrode 2 are in register. Then, the circuit pattern 4 is printed onto the conductive resin. The conductive resin composing the circuit pattern 4 is a mixture of copper powders and epoxy resin. The diameters of copper powders are 1-3 μm. Copper powders, the diameters of which are 30 μm or more are sieved to eliminate them. A 150-mesh screen of SUS is used and an emulsion is 20 μm thick. The mesh screen has a desired pattern photoetched thereon.

Thereafter, the conductive resin of the circuit pattern 4 is hardened by the hardening/drying process 16 at 150° C. for forty minutes.

Then, in the protective film printing process 17, the circuit pattern 4 is coated with an epoxy acrylate resin containing glass fiber of 50-80 μm in length by a 150-mesh screen of SUS using emulsion of 20 μm thick. The viscosity of the epoxy acrylate resin used to coat the circuit pattern 4 is adjusted to be 120,000 cps at 25° C. The epoxy acrylate resin is left at room temperature for about 5 to 10 minutes to make the surface thereof smooth. It is then hardened in the hardening/drying process 18 at 165° C. for 60 minutes. Thus, a resin circuit substrate according to the embodiment is obtained. The protective film printing process 17 and the hardening/drying process 18 may be omitted if a high quality resin circuit substrate is not required. Nevertheless, the essential quality of the resin circuit substrate can be ensured even though the above two processes 17 and 18 are omitted.

The addition of a filler such as glass, ceramic, or carbon to the resin composing the protective film 5 improves the strength and heat resistance thereof.

As apparent from the foregoing description, the embodiment of the present invention provides a novel resin circuit substrate unlike the conventional method of soldering electronic parts onto a wiring circuit substrate made of a resin.

Further, it is possible to manufacture the circuit substrate inexpensively and in a short period of time without a complicated process and skilled workmanship. Therefore, users can manufacture a resin circuit substrate with electronic parts depending on production conditions.

In addition, fine electronic parts can be positioned on the wiring circuit substrate with high accuracy and a high percentage of acceptable products can be manufactured. The embodiment of the present invention eliminates the need for the installation of equipment for performing soldering operations, disposing a washing solution and a discharged gas, and preventing environmental pollution.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A resin circuit substrate comprising:
   a plurality of electronic parts having electrodes to be electrically connected to each other, upper surfaces of the electrodes being disposed flush with each other;
   a molded resin integrally molded about surfaces of the electronic parts other than said upper surfaces of the electrodes so that the electronic pats are retained with the resin, said upper surfaces of said electrodes being substantially devoid of said molded resin; and
   a circuit pattern for electrically connecting the electrodes to each other, the circuit pattern being laminated on the upper surfaces of the electrodes.

2. The resin circuit substrate as claimed in claim 1, wherein the resin is made of a compound selected from the group consisting of epoxy resin, phenolic resin, polyimide resin, and acrylate resin.

3. The resin circuit substrate as claimed in claim 1, wherein the resin contains a filler selected from the group consisting of glass, carbon, ceramic, cloth, and paper.

4. The resin circuit substrate as claimed in claim 1, wherein the circuit pattern is made of a conductive material of a mixture of a resin and a compound selected from the group consisting of Ag, Cu, C, and NiPb/Sn alloy.

5. The resin circuit substrate as claimed in claim 1, wherein the circuit pattern to connect the electrodes of the electronic parts to each other is protected with a resin film.

6. A resin circuit substrate comprising:
   a plurality of electronic parts having electrodes extending upwardly therefrom;
   a molded resin integrally molded about said electronic parts and retaining said electronic parts in a predetermined arrangement, in such a manner that upper surfaces of said electrodes are flush with one another and with an upper surface of said molded resin, to thereby define a substantially planar face; and
   a circuit pattern laminated on said substantially planar face and electrically interconnecting said electrodes of said electronic parts in a predetermined pattern.

7. The resin circuit substrate as claimed in claim 6, wherein
   said molded resin is made of a compound selected from the group consisting of epoxy resin, phenolic resin, polyimide resin, and acrylate resin.

8. The resin circuit substrate as claimed in claim 6, wherein
   said molded resin contains a filler selected from the group consisting of glass, carbon, ceramic, cloth, and paper.

9. The resin circuit substrate as claimed in claim 6, wherein
   said circuit pattern is made of a conductive material formed of a mixture of a resin and a compound selected from the group consisting of AG, CU, C, and NiPb/Sn alloy.

10. The resin circuit substrate as claimed in claim 6, further comprising
    a resin film coated over said circuit pattern to protect said circuit pattern.

* * * * *